US 6,689,664 B2

(12) United States Patent  Park
(10) Patent No.: US 6,689,664 B2
(45) Date of Patent: Feb. 10, 2004

(54) TRANSISTOR FABRICATION METHOD

(75) Inventor: Cheol Soo Park, Kyoungki-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/323,330

(22) Filed: Dec. 18, 2002

(65) Prior Publication Data

US 2003/0119290 A1 Jun. 26, 2003

(30) Foreign Application Priority Data

Dec. 26, 2001 (KR) ................. 10-2001-0085190

(51) Int. Cl.[7] ................. H01L 21/336; H01L 29/76; H01L 27/01
(52) U.S. Cl. ................. 438/282; 438/253; 438/396; 438/180; 438/229; 438/299; 438/364; 257/327; 257/349
(58) Field of Search ................. 438/180, 229, 438/253, 282, 298–304, 364, 396, 764; 257/240–245, 286, 287, 326–333, 349

(56) References Cited

U.S. PATENT DOCUMENTS

| | | | |
|---|---|---|---|
| 5,523,248 A | | 6/1996 | Yamazaki |
| 5,545,579 A | * | 8/1996 | Liang et al. ............ 437/44 |
| 5,981,346 A | * | 11/1999 | Hopper ............ 438/304 |
| 6,087,210 A | | 7/2000 | Sohn |

* cited by examiner

Primary Examiner—Caridad Everhart
Assistant Examiner—Calvin Lee
(74) Attorney, Agent, or Firm—Timothy J. Keefer; Wildman, Harrold, Allen & Dixon LLP

(57) ABSTRACT

A transistor fabrication method comprises: sequentially forming a pad oxide film and a silicon nitride film on a semiconductor substrate; etching the substrate to form a trench; sequentially forming a first oxide film within the trench and a cylindrical insulation spacer at a lateral portion of the first oxide film; forming an insulation pattern; etching the silicon nitride film, the insulation pattern and the insulation spacer; removing the pad oxide film; removing the insulation spacer and the first oxide film; sequentially forming source/drain regions and LDD regions at both sides of the trench, under the remaining insulation pattern; forming a second oxide film; sequentially forming a channel stop layer between the LDD regions and a punch stop layer under the channel stop layer; and sequentially forming a gate insulation film and a gate region within the trench and the second oxide layer.

5 Claims, 3 Drawing Sheets

TRANSISTOR FABRICATION METHOD

BACKGROUND OF THE INVENTION

1. Field of the Invention

The present invention relates to a semiconductor device fabrication method, and more particularly, to a transistor fabrication method capable of reducing both short channel effect and reverse short channel effect.

2. Description of the Prior Art

A semiconductor device based upon a silicon wafer includes device isolation regions for electrically isolating individual circuitry patterns. Since the device isolation regions are formed in an initial stage of a fabrication process and determine the magnitude of active areas and process tolerance of post-processing, research has been actively pursued to reduce isolation regions while reducing the size of a device, as semiconductor devices are gradually getting more highly integrated and ultrafine.

An isolation method via local oxidation of silicon (LOCOS) is widely used in fabrication of semiconductor devices since it advantageously has a simple process. However, in a highly integrated semiconductor device such as a 256M or higher level DRAM, as isolation regions are reduced in width, thickness of a device isolation film is decreased and punch through occurs owing to "bird's beak" effect, thereby deteriorating effectiveness of the LOCOS method.

Another device isolation method using a trench, e.g., Shallow Trench Isolation (hereinafter referred to as STI) has been proposed as an adequate technique for device isolation of high-integrated semiconductor devices.

However, as the integrity of semiconductor devices gradually increases, the channel length of a gate gradually decreases. This disadvantageously increases reverse short channel effect as well as short channel effect.

SUMMARY OF THE INVENTION

The present invention has been made to solve the foregoing problems and it is therefore an object of the present invention to provide a transistor fabrication method capable of reducing both short channel effect and reverse short channel effect.

According to an aspect of the invention for realizing the above object, a transistor fabrication method comprises the following steps of: sequentially forming a pad oxide film and a silicon nitride film on a semiconductor substrate while exposing at least a portion thereof; etching the substrate to form a trench, using the pad oxide film and the silicon nitride film as a mask; sequentially forming a first oxide film within the trench and a cylindrical insulation spacer at a lateral portion of the first oxide film; forming an insulation pattern for covering the inside of the trench, the first insulation film and the insulation spacer; etching the silicon nitride film, the insulation pattern and the insulation spacer to expose the pad oxide film; removing the pad oxide film; removing the insulation spacer and the first oxide film; sequentially forming source/drain regions and LDD regions on the underlying substrate at both sides of the trench, under the remaining insulation pattern; forming a second oxide film on the substrate including the source and drain regions; sequentially forming a channel stop layer between the LDD regions and a punch stop layer under the channel stop layer; and sequentially forming a gate insulation film and a gate region within the trench and the second oxide layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following detailed description will present a preferred embodiment of the invention in reference to the accompanying drawings.

FIGS. 1A to 1F are sectional views illustrating a transistor fabrication process of the invention.

Figure 1A:
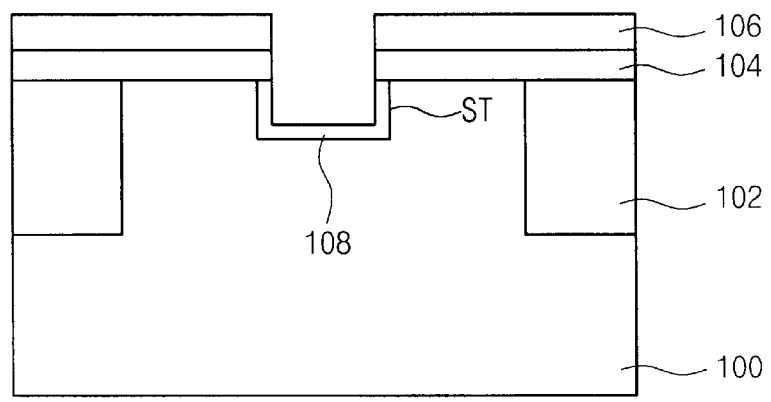
FIGS. 1A to 1F are sectional views illustrating a transistor fabrication process of the invention.

According to an isolation technique for a semiconductor device of the invention, as shown in FIG. 1A, a pad oxide film 104 functioning as a buffer and a first silicon nitride film 106 are sequentially deposited on a semiconductor substrate, and then the first silicon nitride film 106, the silicon oxide film 104 and the semiconductor substrate 100 are etched to a predetermined depth via photolithography, forming a shallow trench ST. In these circumstances, the semiconductor substrate 100 has a well (not shown) and a field oxide film 102 formed via STI.

Thermal oxidation is performed on the resultant substrate structure forming a first oxide film 108 within the shallow trench ST.

Figure 1B:
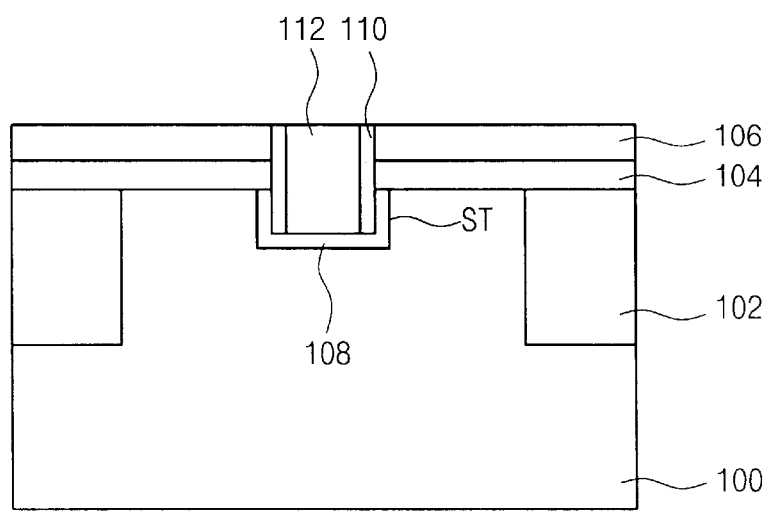

As shown in FIG. 1B, Low Pressure Chemical Vapor Deposition (LPCVD) is carried out on the shallow trench ST including the first oxide film 108, growing a second oxide film. The second oxide film undergoes anisotropic dry etching so as to form an insulation spacer 110. The insulation spacer 110 is configured to surround an inner wall of the trench having the first oxide film and lateral portions of the remaining pad oxide film and the silicon nitride film.

The second oxide film can be made of PSG which has a high wet etching selectivity in respect to the first oxide film. Where the second oxide film is made of PSG, it is etched for about 200 Å when the first oxide film is etched for about 10 Å, owing to a 50 to 1 HF wetting solution in the following wet etching.

After a second silicon nitride film is deposited on the first nitride film 106, the second silicon nitride film undergoes blanket etching or Chemical Mechanical Polishing (CMP) so as to form an insulation pattern 112, which covers the trench ST and the insulation spacer.

Figure 1C:
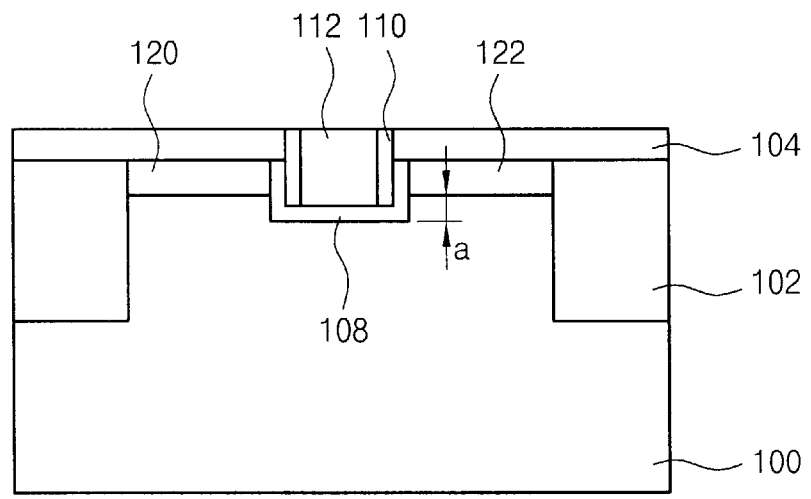

As shown in FIG. 1C, the remaining first silicon nitride film is removed and then CMP or etchback is performed to flatten the insulation pattern 112 and the insulation spacer 110 flush with the pad oxide film 104.

Then ion implantation is performed on the resultant substrate structure, forming source and drain regions 120 and 122. The source and drain regions 120 and 122 are formed over the bottom of the trench ST at a length a of about 300 to 1000 Å.

Figure 1D:
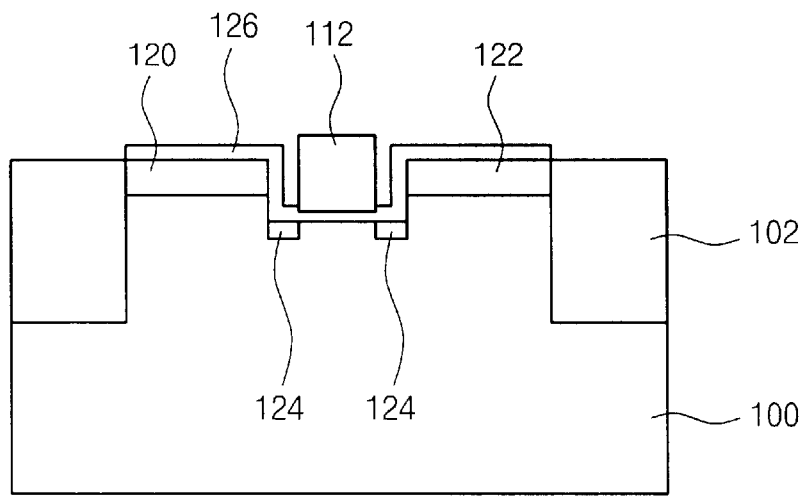

As shown in FIG. 1D, the pad oxide film is removed.

A $P_3PO_4$ wetting solution is used to remove the insulation spacer and the first oxide film within the trench ST, and then ion implantation is again performed forming Lightly Doped Drain (LDD) regions 124 at both sides under the insulation pattern 112.

Then thermal oxidation is performed on the resultant substrate structure so as to form a third oxide film 126 covering the source and drain regions 120 and 122 and the LDD regions 124.

Figure 1E:
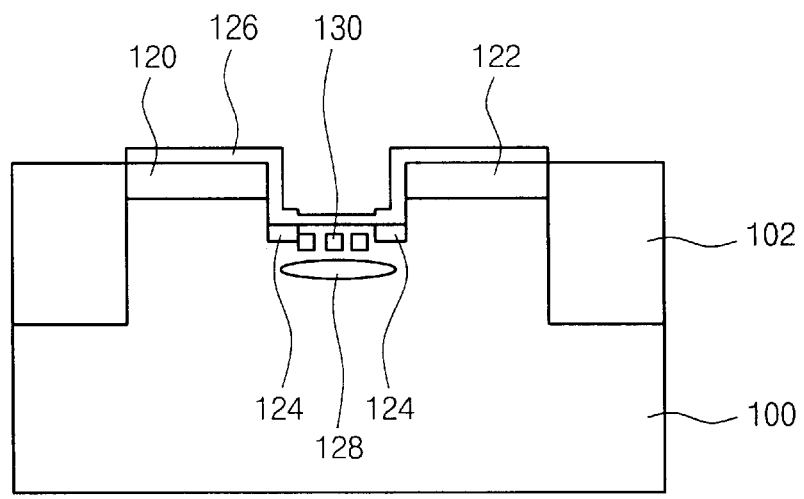

As shown in FIG. 1E, the remaining insulation pattern is removed with a hot H₃PO₄ wetting solution, and then ion implantation is again performed forming a channel stop layer 130 and a punch stop layer 128 under the channel stop layer 130.

Figure 1F:
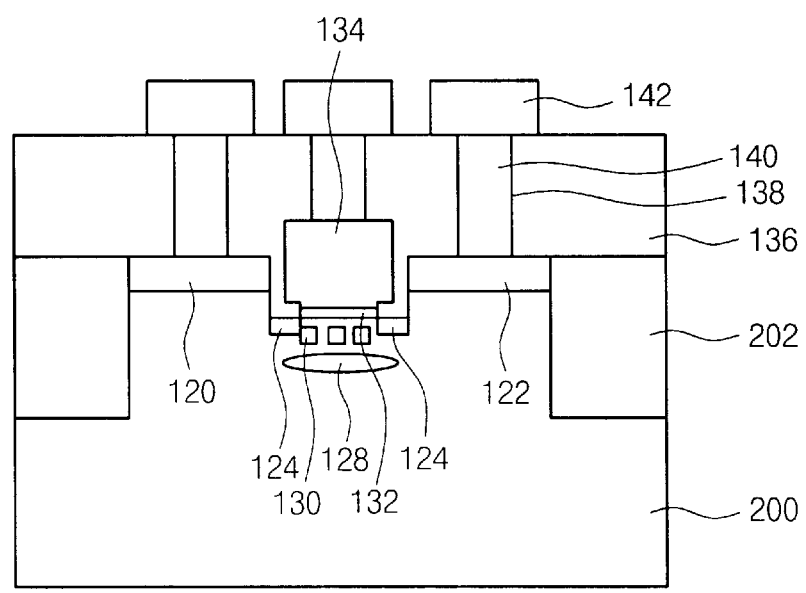

Then, as shown in FIG. 1F, Chemical Vapor Deposition (CVD) is performed within the trench ST having the third oxide film 126 so as to form a gate insulation film 132 and a gate region 134 in sequence.

CVD is again performed on the substrate having the gate region 134, to form an interlayer insulation film 136, which is etched via photolithography to form contact holes 138 each of which exposes each of the source and drain regions 120 and 122 and the gate region 134.

A first metal film made of, for example, tungsten is deposited on the interlayer insulation film 136 via sputtering. Then the first metal film undergoes CMP or etchback to form conductive plugs 140 so that each of the conductive plugs 140 covers each of the contact holes 138, in which a Ti/TiN film (not shown) is interposed between the each contact hole 138 and the each conductive plug 140. The Ti/TiN film not only strengthens the respective adhesive force between each contact hole and each conductive plug but also serves as an anti-reflection layer which can reduce light reflection in the photolithography which follows.

Then a second metal layer made of, for example, Al is deposited on the interlayer insulation film 136 and the conductive plugs 140 via sputtering. The second metal film is etched via photolithography forming metal lines 142 connected with the conductive plugs 140.

As set forth above, the present invention provides source and drain regions at both sides of the trench, LLD regions under the trench, a channel stop layer between the LLD regions and a punch stop layer under the channel stop layer so as to potentially prevent both short channel effect and reverse short channel effect.

Although the preferred embodiments of the present invention have been disclosed for illustrative purposes, those skilled in the art will appreciate that various modifications, additions and substitutions can be made without departing from the scope and spirit of the invention as disclosed in the accompanying claims.

What is claimed is:

1. A transistor fabrication method comprising the steps of:

sequentially forming a pad oxide film and a silicon nitride film on a semiconductor substrate while exposing at least a portion thereof;

etching the substrate to form a trench, using the pad oxide film and the silicon nitride film as a mask;

sequentially forming a first oxide film within the trench and a cylindrical insulation spacer at a lateral portion of the first oxide film;

forming an insulation pattern for covering the inside of the trench, the first oxide film and the insulation spacer;

etching the silicon nitride film, the insulation pattern and the insulation spacer to expose the pad oxide film;

removing the pad oxide film;

removing the insulation spacer and the first oxide film;

sequentially forming source/drain regions and LDD regions on the underlying substrate at both sides of the trench, under the remaining insulation pattern;

forming a second oxide film on the substrate including the source and drain regions;

sequentially forming a channel stop layer between the LDD regions and a punch stop layer under the channel stop layer; and sequentially forming a gate insulation film and a gate region within the trench and the second oxide layer.

2. A transistor fabrication method in accordance with claim 1, wherein the step of forming the insulation spacer comprises:

performing LPCVD on a resultant shallow trench including the first oxide film in order to grow the second oxide film; and performing anisotropic dry-etching on the second oxide film.

3. A transistor fabrication method in accordance with claim 2, wherein the second oxide film is made of PSG which has a high wet etching selectivity in respect to the first oxide film.

4. A transistor fabrication method in accordance with claim 1, further comprising, after the step of forming the gate insulation film and the gate region, the following steps of:

forming an interlayer insulation film on the resultant substrate, the interlayer insulation film having contact holes each of which exposes each of the source and drain regions and gate region;

forming conductive plugs for covering each of the contact holes, respectively; and forming metal lines on the interlayer insulation film for being connected with the conductive plugs.

5. A transistor fabrication method in accordance with claim 1, wherein the LDD region is formed over a bottom of the trench including the first oxide film at a length of about 300 to 1000 Å.

* * * * *